United States Patent [19]

Bhandari

[11] Patent Number: 5,455,578
[45] Date of Patent: Oct. 3, 1995

[54] SERIAL DATA DECODING USING STATE MACHINE WITH SELECTABLE DECODING TABLES

[75] Inventor: Rajan Bhandari, Basingstoke, Great Britain

[73] Assignee: Sony United Kingdom Limited, Staines

[21] Appl. No.: 67,037

[22] Filed: May 26, 1993

[30] Foreign Application Priority Data

Jun. 24, 1992 [GB] United Kingdom ............... 9213430

[51] Int. Cl.⁶ .................................................. H03M 7/30
[52] U.S. Cl. ................................ 341/51; 341/63; 341/64; 341/65; 341/67; 341/106
[58] Field of Search .................. 341/51, 63, 64, 341/65, 67, 100

[56] References Cited

U.S. PATENT DOCUMENTS 5,220,325  6/1993  Ackland et al. ................. 341/67

FOREIGN PATENT DOCUMENTS 0071680  2/1983  European Pat. Off. .
0279799  8/1988  European Pat. Off. .

OTHER PUBLICATIONS

KM Yang et al. IEEE TENCON '90: IEEE Region 10 Conf. on Computer & Comms. Systems (CAT No.: 90CH286602), pp. 551–554, vol. 2; 1990.

*Primary Examiner*—William M. Shoop, Jr.
*Assistant Examiner*—Albert W. Pacadini
*Attorney, Agent, or Firm*—William S. Frommer; Alvin Sinderbrand

[57] ABSTRACT

A serial data decoding system is described in which a state machine (FIG. 5) is provided having a plurality of branching hierarchies of states, each branching hierarchy of states corresponding to a different decoding table. The state machine incorporates a memory 72 storing control data words (FIG. 7). A latch 74 stores the most recent control data word to be output from the memory. The memory 72 is addressed with a read address formed from a concatenation of the latched value 84, a table selecting word 86, Y/C and a received bit of serial data. When the state machine enters a state 88 corresponding to valid code, the current control data word is output as an identifier of that valid code.

10 Claims, 5 Drawing Sheets

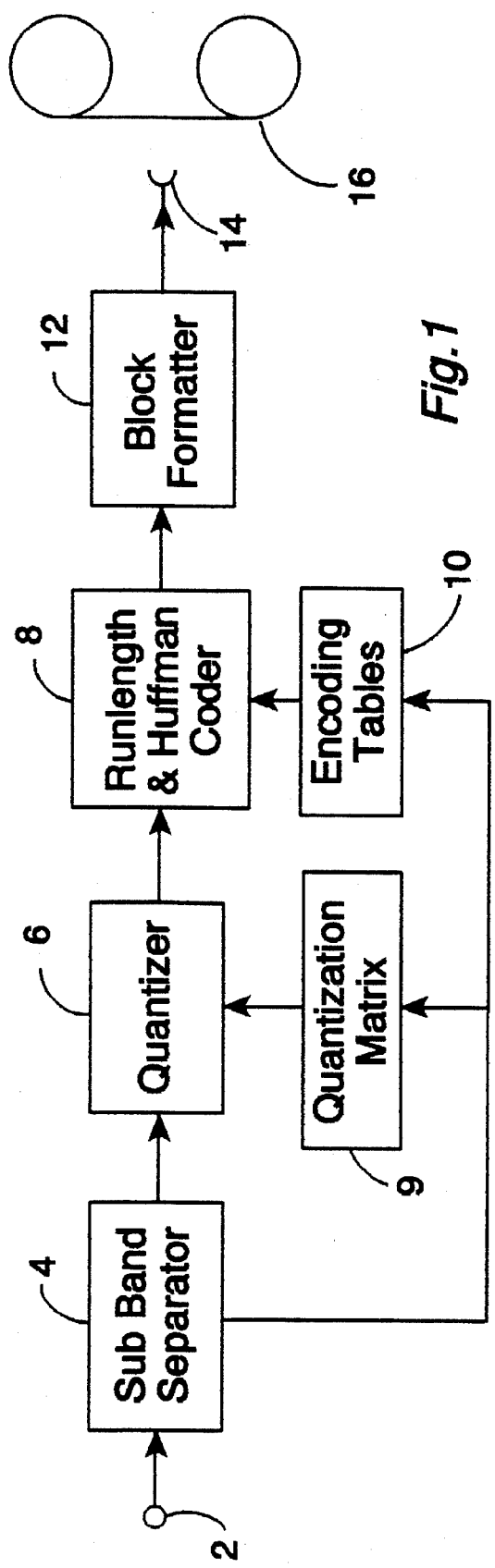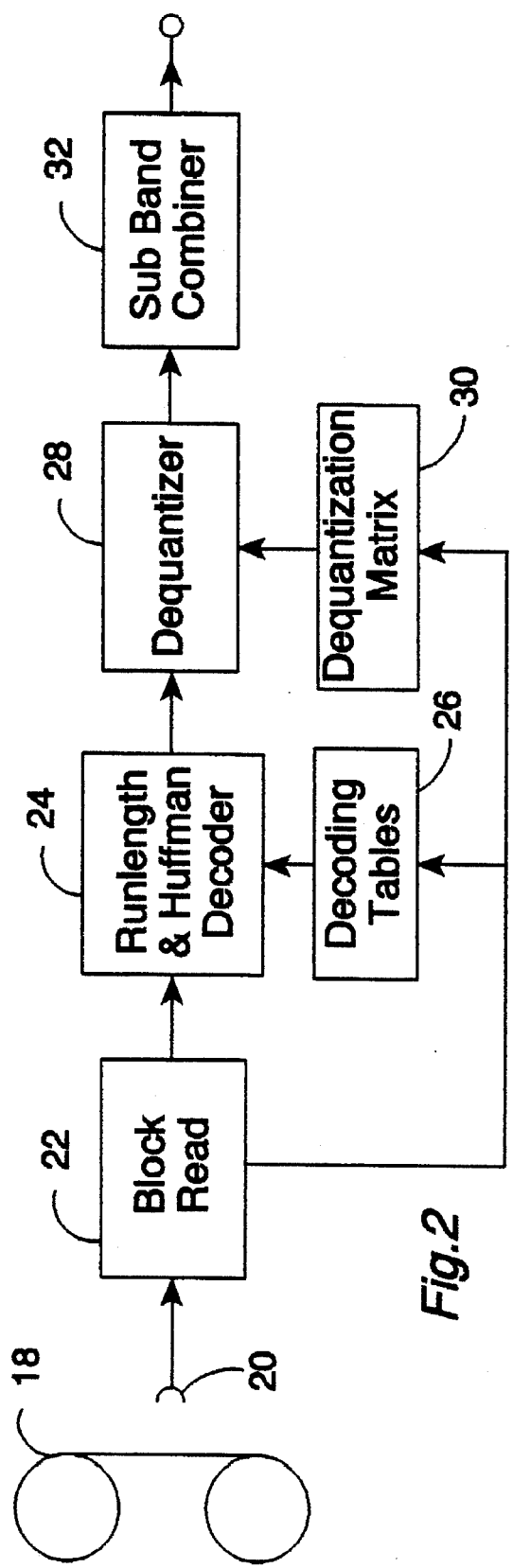

SERIAL DATA DECODING USING STATE MACHINE WITH SELECTABLE DECODING TABLES

BACKGROUND OF THE INVENTION

1. Field of the Invention

This invention relates to the field of serial data decoding. More particularly, this invention relates to the field of serial data decoding utilising state machines.

2. Description of the Prior Art

It is known to provide image data compression systems that generate a serial data stream of compressed and encoded data for transmission or recording prior to subsequent decoding and decompression. An example of such a system is that proposed by the Joint Photographic Experts Group (JPEG). In order to increase compression efficiency in such systems, it has been proposed to use a plurality of coding tables each matched to a particular part of the data to be compressed. A coding table that is effective for data containing long runs of zero values is unlikely to be well suited to the coding of data in which runs of zero values are uncommon. The use of a plurality of coding tables allows each coding table to be better suited to exploiting the characteristics of the type of data it is being used to encode.

The JPEG system was conceived as a still image compression system primarily intended for non-real time use with general purpose computers. In such general purpose computers, the task of using a plurality of differing coding tables can be achieved in a relatively straight forward fashion with appropriate software. However, if it is desired to produce a real time system for compressing and decompressing a sequence of images at a rate of perhaps 50 per second, then it is difficult for a general purpose computer operating under software control to cope with the necessary data processing load.

In order to increase processing speed, dedicated hardware may be used to achieve higher speed operation. Such a system may incorporate several different processing stages such as decorrelation, quantisation, run length coding and Huffman coding. One significant part of such a system is serial data encoding and decoding. One way of implementing serial data decoding is to use a state machine in which each received bit of data controls the next state into which the state machine passes until a state corresponding to a valid code is reached whereupon the valid code may be outputted and the state machine reset. Whilst such state machine implementations can provide high speed operation, it is difficult to accommodate the use of a plurality of decoding tables.

SUMMARY OF THE INVENTION

This invention provides a serial data decoder for generating output data words according to a selectable one of a plurality of decoding tables, said serial data decoder comprising a state machine having:

(i) a memory with a plurality of address locations each storing a control data word;

(ii) a latch for storing a most recent control data word output from said memory;

(iii) means For generating a table selecting word, each table selecting word corresponding to a different decoding table;

(iv) a read address bus for supplying a read address to said memory, said read address being formed from a concatenation of at least part of said control data word read from said latch, said table selecting word and a received bit of serial data and said memory being responsive to said read address to output a new control word to said latch corresponding to moving said state machine to a new state; and (v) means responsive to a valid code flag within a control data word output from said memory at a state of said state machine corresponding to receipt of a valid code for outputting said control data word as an identifier of said valid code.

The provision within this state machine of a read address formed from a concatenation of data read from the preceding memory location, a table selecting word and the latest received bit of data allows the state machine to incorporate a plurality of branching hierarchies of states with the table selecting word portion of the read address controlling which branching hierarchy and corresponding decoding table is being used. Furthermore, the use of the control data word at a state corresponding to a valid code as an identifier of that valid code (either directly or indirectly) allows the state machine itself to carry out an advantageously large part of the decoding function.

In some situations, such as the decoding of luminance and chrominance image data, the serial data may comprise a plurality of data sections, e.g. luminance data sections and chrominance data sections. In such a circumstance it is desirable that each data section has its own set of decoding tables associated with it that are matched to that particular data section. Within that set of decoding tables, different coding tables will be matched to different parts of that data section.

An effective way of selecting which decoding table should be used within a data section is provided when said means for generating a table selecting word comprises a table counter generating a table count value, indicative of which decoding table is to be used within a data section, that is concatenated with a data section value, indicative of which set of decoding tables are to be used for a current data section, to form said table selecting word.

The control data words can be used to control the table count value by including within them a table increment flag for incrementing said table count value.

This table increment takes advantage of the feature that although different decoding tables may be used within a data section, the decoding tables used will generally follow a predetermined sequence that can be arranged to follow an incrementing table count value.

In order to provide co-ordination between the decoding tables used for each data section, in preferred embodiments of the invention a change in data section value resets said table count value to a start table value.

In order to make the process of decoding the serial data less prone to interruptions of that serial data (e.g. interruptions during abnormal speed replay), in preferred embodiments of the invention said serial data comprises blocks of serial data, each block including a plurality of data sections and including a block header specifying said start table value.

The provision of the block header specifying the start table value has the effect that the decoding of one block can be made independent of the decoding of another block. Thus, if one block of coded data is corrupted due to a fault (e.g. a fault in a storage media), then the loss of data is limited to only that block.

In order to further enhance this ability to cope with interrupted serial data and to account for variation in the sizes of data sections, in preferred embodiments of the invention said block header includes a pointer to a boundary between data sections within said block, and said state machine includes a counter responsive to received bits of serial data to provide an indication of position within each block during decoding and a comparator for comparing said pointer and said indication of position and for changing said data section value at said boundary.

The pointer within the block header allows the boundary between data sections to be at a variable position and allows each block to be decoded independently of other blocks.

Viewed from another aspect the invention provides a method of serial data decoding for generating output data words according to a selectable one of a plurality of decoding tables using a state machine, said method comprising the steps of:

(i) outputting a control data word from a memory with a plurality of address locations each storing a control data word;

(ii) storing in a latch a most recent control data word output from said memory;

(iii) generating a table selecting word, each table selecting word corresponding to a different decoding table;

(iv) supplying a read address to said memory, said read address being formed from a concatenation of at least part of said control data word read from said latch, said table selecting word and a received bit of serial data and said memory being responsive to said read address to output a new control word to said latch corresponding to moving said state machine to a new state; and (v) in response to a valid code flag within a control data word output from said memory at a state of said state machine corresponding to receipt of a valid code, outputting said control data word as an identifier of said valid code.

The above, and other objects, features and advantages of this invention will be apparent from the following detailed description of illustrative embodiments which is to be read in connection with the accompanying drawings.

BRIEF DESCRIPTION Of THE DRAWINGS

FIG. 1 illustrates an apparatus for compressing and recording image data;

FIG. 2 illustrates an apparatus for reproducing and decompressing image data;

DESCRIPTION Of THE PREFERRED EMBODIMENTS

Figure 3:
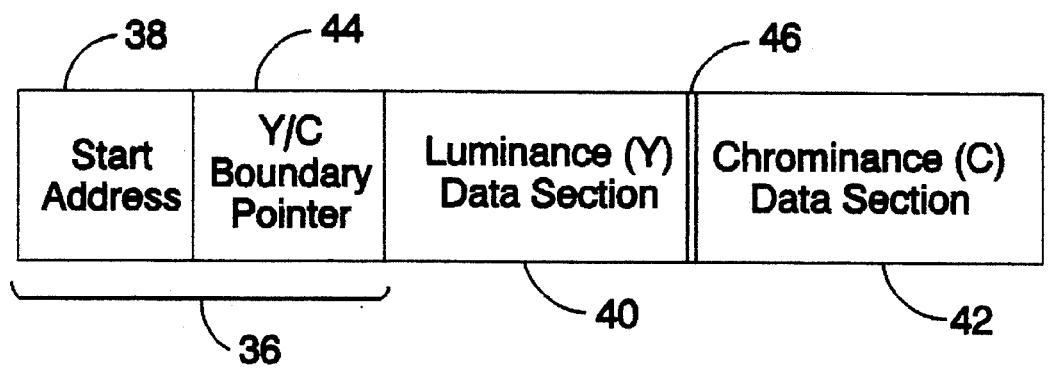
FIG. 3 illustrates a data block from within a serial data stream.

FIG. 1 shows an image data compressing and recording apparatus. Image data is input at input node 2 and passed to a sub band separator 4. The sub band separator 4 includes banks of horizontal and vertical finite impulse response filters that serve to split and decimate the data into sub band components in the two dimensional spatial frequency domain (i.e. sub band transformation). Transformed data is then passed to a quantizer 6 where it is subject to a lossy quantization operation under control of data stored within a quantization matrix 9. The data output from the quantizer 6 is passed to a runlength and Huffman coder 8. The runlength and Huffman coder 8 applies one of a plurality coding tables 10 to the data depending upon which sub band component the data originates from. The runlength and Huffman coder 8 exploits correlation within the data to effect compression. The output from the runlength and Huffman coder 8 is passed to a block formatter 12 which splits the data into a sequence of blocks of data in a serial data stream. This serial data stream is recorded via recording head 14 onto magnetic tape 16. Each block of data includes a header indicating the nature of the data contained in that block.

The sub band separator 4 outputs a signal indicative of which sub band component is currently being passed to the quantizer 6 and the runlength and Huffman coder 8. This signal is supplied to the quantization matrix 9 and the encoding tables 10 to select the degree of quantization and which encoding table are to be applied to that sub band component.

FIG. 2 illustrates a reproducing and decompressing apparatus. A stream of serial data is read from a magnetic tape 18 by a read head 20 into a block read unit 22. The serial data is in the format of the sequence of blocks each including a header as described above. The block read unit 22 reads the header information and passes the serial data onto a runlength and Huffman decoder 24. The runlength and Huffman decoder 24 applies a selected decoding table 26 to the data and passes its output to a dequantizer 28. The dequantizer 28 applies a selected dequantization value from a dequantization matrix 30 to the data. The dequantized data is passed to a sub band combiner 32 where a bank of horizontal and vertical interpolating finite impulse response filters transform the data from the sub band domain to the spatial domain. The decoded, de-quantized and transformed data is then fed to output node 34.

The block read unit 22 extracts from the header of each block data indicating which sub band component the data within the block represents and uses this to select which of the decoding tables 26 is applied and what dequantization value is selected from the dequantization matrix at 30.

FIG. 3 illustrates a data block of the format used in the serial data stream recorded on the magnetic tape 16, 18. A header 36 includes a start address 38 indicating the start position of the luminance data section 40 and the chrominance data section 42 within the transformed image. A Y/C boundary pointer 44 within the header 36 gives the position 46 within the block at which the luminance data section 40 changes to the chrominance data section 42. The position 46 varies in dependence upon the relative degree of compression achieved for the luminance data and the chrominance data for a given section of the transformed image. Each block contains luminance data and chrominance data from the same section of the transformed image so as to facilitate the production of at least some form of image during shuttle replay in which only a fraction of the blocks of data are correctly read.

Figure 4:
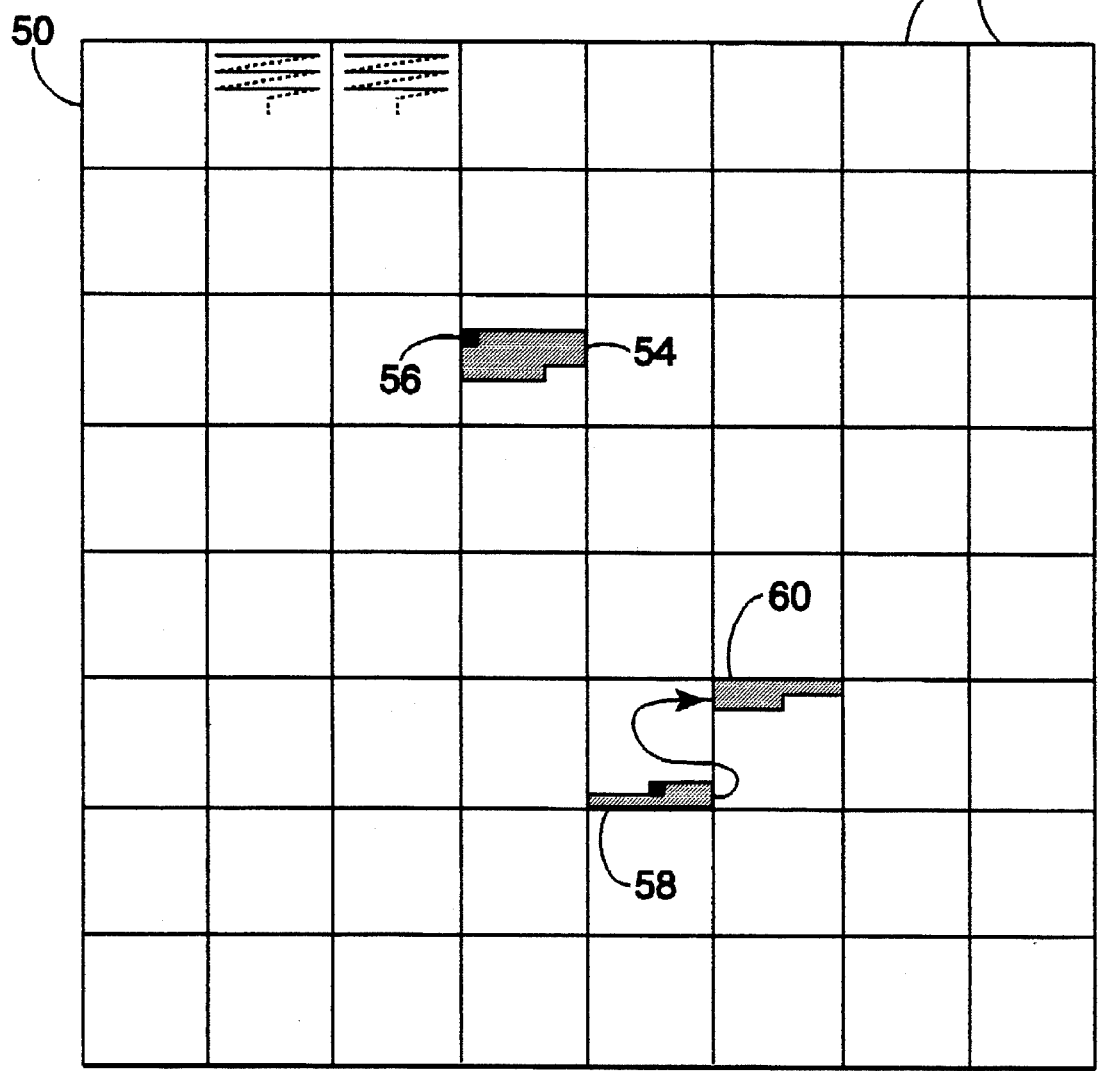
FIG. 4 illustrates the relationship between a data block of the type illustrated in FIG. 3 and position within an array of sub band components.

FIG. 4 illustrates an 8*8 array of two dimensional sub band spatial frequency components. Each sub band component 48 contains an array of sub band component data values. In a typical image, the information content is mainly in the lower spatial frequencies. The lowest spatial frequency sub band component 50 (the "DC" sub band) will have different characteristics to the highest frequency sub band component 52. Each of the sub band components 48 is subject to quantization with a matched quantization value selected from a quantization matrix and encoded with a matched coding table. The data within each sub band component 48 is raster scanned to form a serial data stream that is then subject to quantization and encoding. When the end of one sub band has been reached, the next sub band is raster scanned.

The finite size of the blocks of data illustrated in FIG. 3 has the effect that each particular block corresponds to particular section of the transformed image such as section 54. The start address 38 specifies the start position 56 of the section 54 within the transformed image.

Some data blocks will correspond to a section of the transformed image with a part 58 in one sub band and a part 60 in another sub band. In the case that these two sub bands require different coding tables, a switch of coding table is required part way through the encoding of the block in question and part way through the decoding of the block in question.

FIG. 4 illustrates the data comprising one of the luminance and chrominance data for an image. It will be understood that an analogous arrangement of sub band components, scanning patterns and relationships of data blocks to positions within sub bands will exist for the data representing the other of the luminance and chrominance components.

Figure 5:
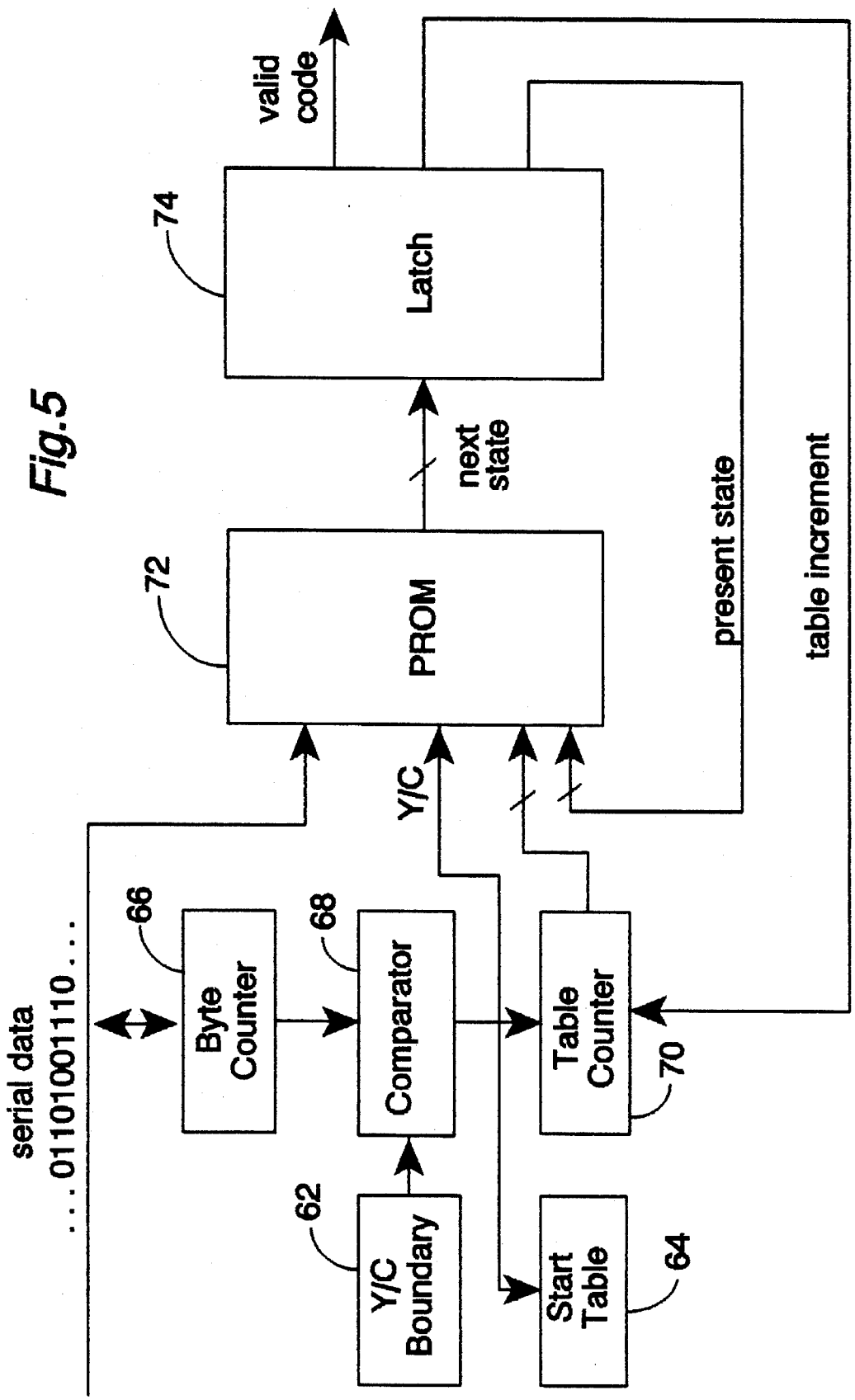
FIG. 5 illustrates a state machine serial data decoder.

FIG. 5 illustrates a state machine decoder. The Y/C boundary pointer 44 from the header 36 of each block is loaded into a Y/C boundary memory 62 by the block read unit 22 at the start of each data block. The start address 38 from the header 36 is decoded to give an indication of which coding table should be used at the start of the luminance data section 40 and chrominance data section 42 of the data block in question. This starting table is stored within a start table memory 64. As the serial data from the data block in question is received, a byte counter 66 counts the number of bytes received. A comparator 68 compares the number of bytes received with the Y/C boundary pointer to determine if the point 46 has been reached. When the point 46 is reached, a switching signal Y/C is generated.

At the start of each data block, the starting table value stored in the start table memory 64 is loaded into a table counter 70 and in addition, when the comparator 68 generates a switching signal Y/C, this is fed to the table counter 70 and the start table memory 64 to reload the table counter 70 with the initial starting table value.

A programmable read only memory (PROM) 72 is addressed with an address value formed from a concatenation of a fed back present state value, a table count value from table counter 70, the switching signal Y/C and the next received bit of the serial data to be decoded. This concatenated address value acts to access a specific memory location within the PROM 72 and feed the contents of this memory location to a latch 74 where it is stored.

One bit of the latched value indicates whether or not a state corresponding to a valid code has been reached. Another bit of the latched value indicates whether an internal table selecting word has been received and if so feeds this back to the table counter 70 so as to increment the table count value stored therein. The remainder of the latched bits are fed back to the PROM 72 as present state values controlling the next memory location to be read and corresponding state to be entered. When a valid code is indicated, the present state value is read out as an index value to be mapped elsewhere to the actual value of the valid code.

Figure 6:
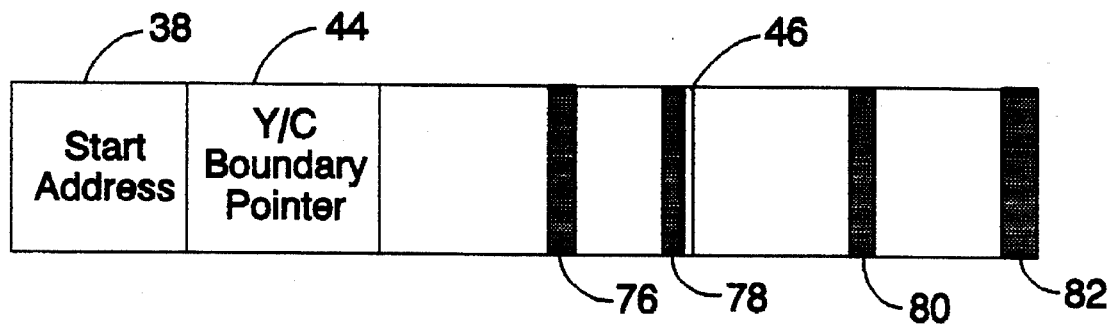
FIG. 6 illustrates the occurrence of special control code words within a data block of the type illustrated in FIG. 3.

FIG. 6 illustrates a data block including various special code words 76, 78, 80 and 82. The special code words 76 and 80 are internal table selecting words. When the state machine of FIG. 5 enters a state indicating the completed reception of such an internal table selecting word, then the table increment flag is raised serving to increment the table count value stored in the table counter 70. The internal table selecting word is chosen to be a run of 1s of a predetermined length. This has the advantage that this code will be the lowest probability Huffman code and so should not severely impact the Huffman coding efficiency. Furthermore, since this word has no phase content, the full or partial insertion of the word into the serial data stream is made easier.

At the end of the luminance data section 40, and immediately prior to the point 46, a further special code 78 is inserted to place the state machine into transfer states that are distinct from all possible slates that the state machine may adopt during decoding using any other decoding table and to bring the luminance data section 40 up to a byte boundary. Even if the luminance data section 40 without the special code 78 would finish on a byte boundary, a special code 78 is nevertheless inserted so as to make possible an unambiguous inter-component transfer. The asserting of the switching signal Y/C at point 46 after the state machine has adopted the transfer states serves to reset the state machine to the top of the branching hierarchy corresponding to the chrominance decoding table indicated by the contents of the start table memory 64. Since the system is reset after receipt of the special code 78 before any further data is decoded, in practice the same special code of a sequence of 1s can be used here as for the internal table selecting word.

The "present state" values for each of the partially decoded and fully decoded states of the internal table selecting words within each of the branching hierarchies are unique. In this way, these states can serve as the transfer states from which table switches can be made without the risk of any ambiguity as to which state the state machine is in.

At the end of the chrominance data section 42 is a filler word 82 that serves to bring the data block up to its predetermined size. Again, since the state machine will be reset before decoding any further data, the filler word 82 can be a sequence of all 1s. It will be appreciated that the special code words 78 and 82 will not be of fixed length and will respectively have the length necessary to bring the luminance data section up to a byte boundary and that necessary to completely fill the chrominance data section. In the case of the filler word 82, the filler may correspond to several complete internal table selecting words and accordingly will cycle the table count value through several increments. This does not matter since the system will be reset before any further decoding takes place.

Figure 7:
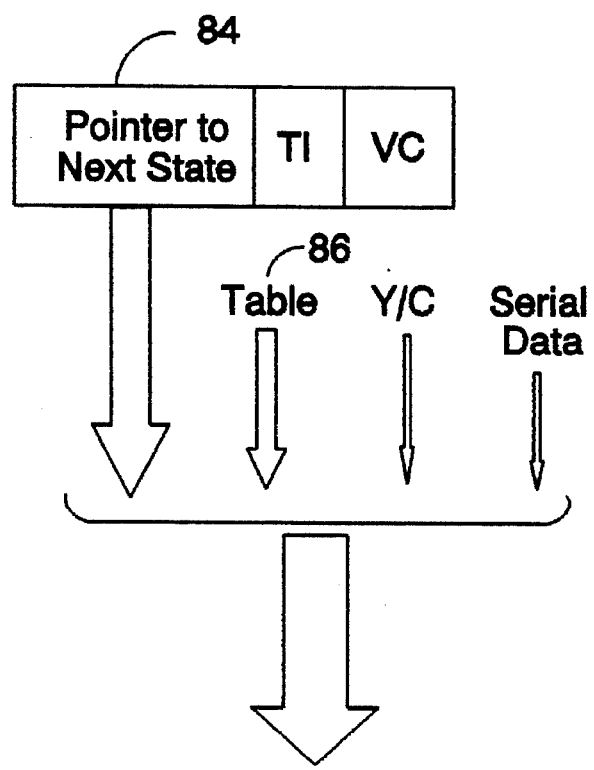
FIG. 7 illustrates the data used to control the movement between states of the state machine illustrated in FIG. 5.

FIG. 7 illustrates the control data stored within the memory locations of the PROM 72. Each memory location stores a pointer to the next state 84 and bits indicating whether the table count value should be incremented TI and that a state corresponding to a valid code has been reached VC. The pointer to the next state 84 is concatenated with the table count value 86, the switching signal Y/C and the serial data to produce the next state address supplied on what can be considered as a composite read address bus to the PROM 72.

Figure 8:
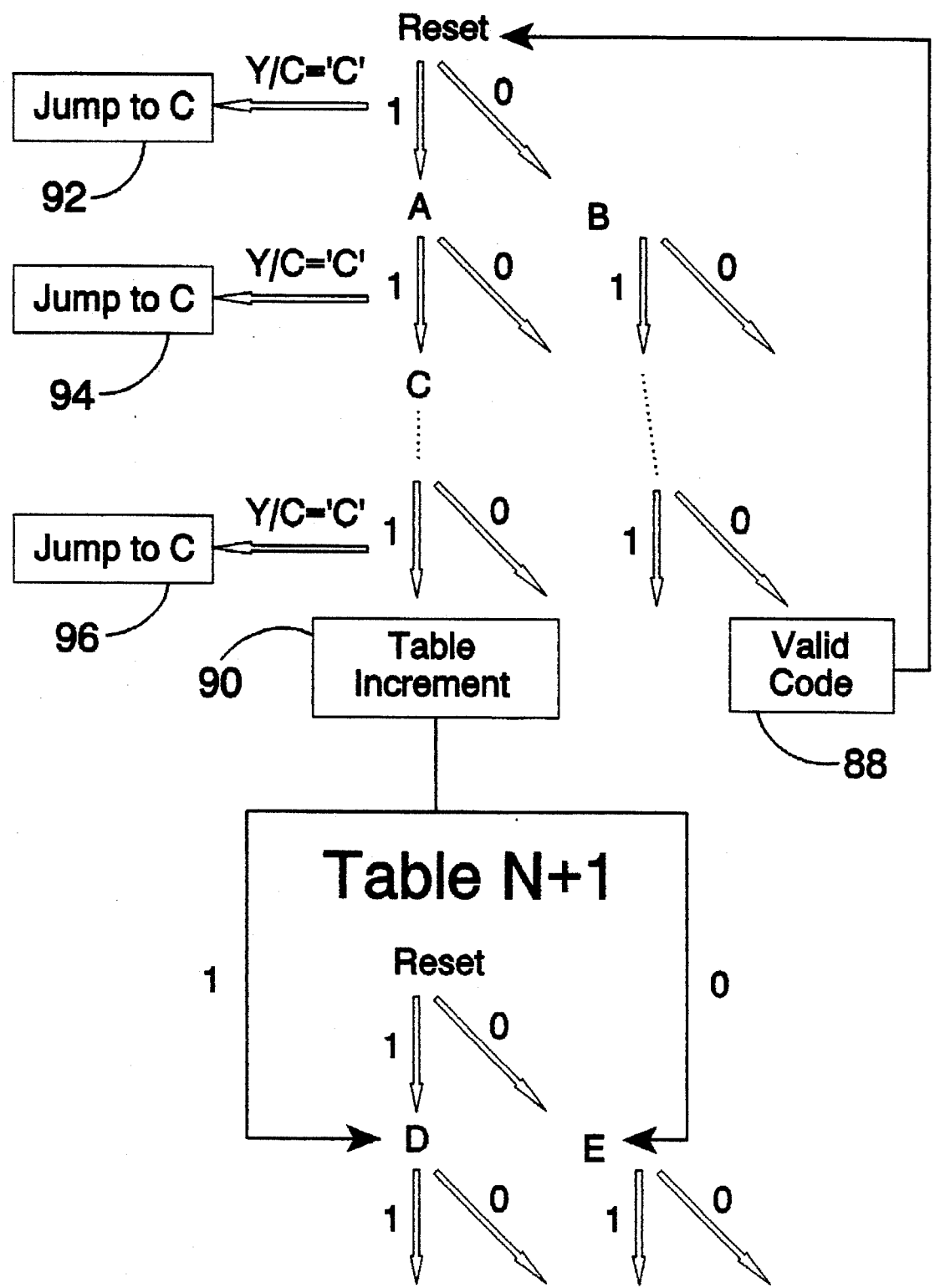
FIG. 8 schematically illustrates two branching hierarchies of states and possible movements from these hierarchies.

FIG. 8 schematically illustrates two branching hierarchies corresponding respectively to coding tables N and N+1.

From the reset state at the start of each of the tables, the state machine branches to one of either of two states A or B depending upon whether a serial data bit of 1 or 0 is received. Decoding proceeds down the branching hierarchy until a state such as state 88 is reached corresponding to a valid code. At this point, the present state value is read as an index to the code value and the state machine returns to the reset state.

In the case of the receipt of a succession of 1s the state machine proceeds through a sequence of transfer states A, C etc. to a state 90 corresponding to receipt of the internal table selecting word whereupon the table count value is incremented. Each of these states A, C, etc. is distinct from any other state of the state machine such that if the externally applied switching signal Y/C is activated then an unambiguous jump to the first of the chrominance decoding tables may be made as illustrated by states 92, 94 and 96.

When the state 90 is reached corresponding to receipt of the complete special code word then the state machine progresses to either state D or state E upon the next cycle depending upon whether a 1 or 0 is received. If the serial data stream is at the end of the chrominance data section 42 and the bits of data being received are a filler word, then several tables may in fact be moved through prior to reaching the end of the data block.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A serial data decoder for generating output data words according to a selectable one of a plurality of decoding tables from serial data comprising a plurality of data sections, differing sets of decoding tables being used for differing data sections and differing decoding tables being used for differing parts of each data section, said serial data decoder comprising a state machine comprising:

a memory with a plurality of address locations each storing a control data word;

a latch for storing a most recent control data word output from said memory;

means for generating a table selecting word in response to a number of received bytes of said serial data, said means for generating including a table counter for generating a table count value, indicative of which decoding table is to be used within a data section, that is concatenated with a data section value, indicative of which set of decoding tables are to be used for a current data section, to form a table selecting word, each table selecting word corresponding to a different decoding table;

a read address bus for supplying a read address to said memory, said read address being formed from a concatenation of at least part of said control data word read from said latch, said table selecting word and a received bit of said serial data and said memory being responsive to said read address to output a new control word to said latch corresponding to moving said state machine to a new state; and means responsive to a valid code flag within a control data word output from said memory at a state of said state machine corresponding to receipt of a valid code for outputting said control data word as an identifier of said valid code.

2. A serial data decoder as claimed in claim 1, wherein said control data words include a table increment flag for incrementing said table count value.

3. A serial data decoder as claimed in claim 1, wherein a change in data section value resets said table count value to a start table value.

4. A serial data decoder as claimed in claim 3, wherein said serial data comprises blocks of serial data, each block including a plurality of data sections and including a block header specifying said start table value.

5. A serial data decoder as claimed in claim 4, wherein said block header includes a pointer to a boundary between data sections within said block, and said state machine includes a counter responsive to received bits of serial data to provide an indication of position within each block during decoding and a comparator for comparing said pointer and said indication of position and for changing said data section value at said boundary.

6. A method of serial data decoding for generating output data words using a state machine according to a selectable one of a plurality of decoding tables from serial data comprising a plurality of data sections, differing sets of decoding tables being used for differing data sections and differing decoding tables being used for differing parts of each data section, said method comprising the steps of:

outputting a control data word from a memory with a plurality of address locations each storing a control data word;

storing in a latch a most recent control data word output from said memory;

generating a table count value, indicative of which decoding table is to be used within a data section, in response to a number of received bytes of said serial data;

concatenating said table count value with a data section value, indicative of which set of decoding tables are to be used for a current data section to form a table selecting word, each table selecting word corresponding to a different decoding table;

supplying a read address to said memory, said read address being formed from a concatenation of at least part of said control data word read from said latch, said table selecting word and a received bit of said serial data and said memory being responsive to said read address to output a new control word to said latch corresponding to moving said state machine to a new state; and in response to a valid code flag within a control data word output from said memory at a state of said state machine corresponding to receipt of a valid code, outputting said control data word as an identifier of said valid code.

7. A method of serial data decoding as claimed in claim 6, wherein said control data words include a table increment flag for incrementing said table count value.

8. A method of serial data decoding as claimed in claim 6, wherein a change in data section value resets said table count value to a start table value.

9. A method of serial data decoding as claimed in claim 8, wherein said serial data comprises blocks of serial data, each block including a plurality of data sections and including a block header specifying said start table value.

10. A method of serial data decoding as claimed in claim 9, wherein said block header includes a pointer to a boundary between data sections within said block, and further comprising the steps of: providing an indication of position within each block during decoding in response to received bits of serial data, comparing said pointer and said indication of position and changing said data section value at said boundary.

* * * * *